United States Patent
Minari et al.

(10) Patent No.: US 9,431,519 B2
(45) Date of Patent: Aug. 30, 2016

(54) METHOD OF PRODUCING A III-V FIN STRUCTURE

(71) Applicants: IMEC VZW, Leuven (BE); Sony Corporation, Tokyo (JP)

(72) Inventors: Hideki Minari, Minato-ku (JP); Shinichi Yoshida, Minato-ku (JP); Geoffrey Pourtois, Villers-la-Ville (BE); Matty Caymax, Leuven (BE); Eddy Simoen, Ichtegem (BE)

(73) Assignees: IMEC VZW, Leuven (BE); Sony Corporation, Tokyo (JP)

(*) Notice: Subject to any disclaimer, the term of this patent is extended or adjusted under 35 U.S.C. 154(b) by 0 days.

(21) Appl. No.: 14/719,995

(22) Filed: May 22, 2015

(65) Prior Publication Data

US 2015/0340503 A1 Nov. 26, 2015

(30) Foreign Application Priority Data

May 22, 2014 (EP) .................................... 14169499

(51) Int. Cl.
*H01L 27/088* (2006.01)
*H01L 21/336* (2006.01)
(Continued)

(52) U.S. Cl.
CPC ... *H01L 29/66795* (2013.01); *H01L 21/02538* (2013.01); *H01L 21/2855* (2013.01); *H01L 21/28556* (2013.01); *H01L 21/32051* (2013.01); *H01L 21/32053* (2013.01); *H01L 21/32134* (2013.01); *H01L 21/32135* (2013.01); *H01L 21/76224* (2013.01); *H01L 29/0653* (2013.01);
(Continued)

(58) Field of Classification Search
CPC ................................ H01L 21/76224

USPC ........................................... 257/401; 438/429
See application file for complete search history.

(56) References Cited

U.S. PATENT DOCUMENTS 6,207,531 B1 3/2001 Pen-Liang
8,470,714 B1 6/2013 Tsai et al.
(Continued)

FOREIGN PATENT DOCUMENTS

| EP | 2 343 731 A2 | 7/2011 |
| EP | 2 775 528 A1 | 9/2014 |
| WO | 2007/014294 A2 | 2/2007 |

OTHER PUBLICATIONS

European Search Report, European Patent Application No. 14169499.2, dated Jan. 23, 2015.
(Continued)

*Primary Examiner* — Matthew Landau
*Assistant Examiner* — Igwe U Anya
(74) *Attorney, Agent, or Firm* — McDonnell Boehnen Hulbert & Berghoff LLP

(57) ABSTRACT

A method of producing a III-V fin structure within a gap separating shallow trench isolation (STI) structures and exposing a semiconductor substrate is disclosed, the method comprising providing a semiconductor substrate, providing in the semiconductor substrate at least two identical STI structures separated by a gap exposing the semiconductor substrate, wherein said gap is bounded by said at least two identical STI structures, and, producing a III-V fin structure within said gap on the exposed semiconductor substrate, and providing a diffusion barrier at least in contact with each side wall of said at least two identical STI structures and with side walls of said III-V fin structure and wherein said semiconductor substrate is a Si substrate.

13 Claims, 14 Drawing Sheets

(51) Int. Cl.

| | | |
|---|---|---|
| *H01L 29/66* | (2006.01) | |
| *H01L 29/20* | (2006.01) | |
| *H01L 29/06* | (2006.01) | |
| *H01L 21/02* | (2006.01) | |
| *H01L 21/285* | (2006.01) | |
| *H01L 21/762* | (2006.01) | |
| *H01L 21/3205* | (2006.01) | |
| *H01L 21/3213* | (2006.01) | |
| *H01L 29/78* | (2006.01) | |

(52) U.S. Cl.
CPC ......... *H01L 29/20* (2013.01); *H01L 29/66522* (2013.01); *H01L 29/7851* (2013.01); *H01L 21/0262* (2013.01); *H01L 21/02543* (2013.01); *H01L 21/02546* (2013.01); *H01L 21/02579* (2013.01)

(56) References Cited

U.S. PATENT DOCUMENTS

| | | |
|---|---|---|
| 2005/0061768 A1 | 3/2005 | Fucsko et al. |
| 2005/0224875 A1 | 10/2005 | Anderson et al. |
| 2007/0134884 A1 | 6/2007 | Kim et al. |
| 2009/0007036 A1* | 1/2009 | Cheng ................... H01L 21/845 716/106 |
| 2011/0084355 A1 | 4/2011 | Lin et al. |
| 2011/0097889 A1 | 4/2011 | Yuan et al. |
| 2011/0140229 A1 | 6/2011 | Rachmady et al. |
| 2012/0001239 A1 | 1/2012 | Ko et al. |
| 2012/0205747 A1* | 8/2012 | Yamada ................ H01L 29/517 257/368 |
| 2013/0119507 A1 | 5/2013 | Lee et al. |
| 2014/0001519 A1* | 1/2014 | Dewey .............. H01L 29/66795 257/288 |
| 2014/0191324 A1* | 7/2014 | Cai ....................... H01L 29/785 257/368 |
| 2014/0213037 A1* | 7/2014 | LiCausi ............ H01L 21/76224 438/429 |
| 2014/0302653 A1* | 10/2014 | Yeh ................... H01L 29/66818 438/283 |
| 2014/0357039 A1* | 12/2014 | Liu .................. H01L 21/76224 438/296 |
| 2015/0303249 A1* | 10/2015 | Bentley ............... H01L 29/0649 257/622 |

OTHER PUBLICATIONS

Minari, H. et al., "Defect Formation in III-V Fin Grown by Aspect Ratio Trapping Technique: A First-Principles Study", 2014 IEEE International Reliability Physics Symposium, Jun. 1, 2014, pp. PI2.1-P1.2.5.

* cited by examiner

METHOD OF PRODUCING A III-V FIN STRUCTURE

CROSS-REFERENCE TO RELATED APPLICATION

This application claims priority to European Patent Application No. 14169499.2 filed on May 22, 2014, the contents of which are hereby incorporated by reference.

FIELD OF THE DISCLOSURE

The present disclosure is related to the field of semiconductor processing. More specifically, it is related to a method of producing a III-V fin structure of a semiconductor device in a substrate.

BACKGROUND OF THE DISCLOSURE

CMOS scaling according to Moore's law has been providing the semiconductor industry with reduced transistor size while offering enhanced performance. However, in order to continue scaling, new channel materials having a high carrier velocity may be desirable.

Field effect transistors (FinFETs) incorporating fin structures having III-V compound semiconductors as channel material are considered to be attractive candidates for high-performance n-type FETs in the semiconductor industry.

Use of III-V substrates for the production of such FinFETs may be a challenging task due to III-V materials lacking thermally and electrically stable native oxides. Therefore, during Shallow Trench Isolation (STI) formation, where a dielectric material (such as $SiO_2$) is deposited to fill trenches made in the III-V substrate, an electrically active and thermally unstable interface can form between the STI and the III-V substrate. Such interface can lead to a high leakage path between gate, source, and/or drain regions of the transistor. In U.S. Patent Application Pub. No 2011/0140229 A1, a method for forming a STI structure is disclosed, where a passivation layer is applied on the surfaces of the shallow trench isolation made in the substrate. The passivation layer restricts free bonding electrons of the substrate material by covalently bonding to them. The substrate material is disclosed to include Ge, SiGe or III-V material. Additionally, the passivation layer is oxidized, thereby forming a bi-layer to form an electrically defect-free interface.

Although the problem of making FETs starting from a III-V substrate can be solved by the use of the passivation layer as disclosed in US 2011/0140229 A1, use of III-V material as the substrate material remains a challenge due to the production of FinFETs on III-V substrates being expensive. Furthermore, it may be difficult to co-integrate of III-V channels and Ge channels, as Ge is a candidate for high-performance p-type FETs.

Therefore, the integration of III-V FinFETs on a Si substrate may be advantageous with respect to cost effectiveness, and may open doors to co-integration of III-V with Ge channels. However, large lattice mismatch between III-V materials and silicon makes it a technological challenge to grow III-V materials on silicon. Such large lattice mismatch between III-V materials and the Si substrate leads to the formation of crystalline defects, such as dislocations, antiphase boundaries, twins and stacking faults. Presence of these defects are detrimental for device performance.

A technique called Aspect Ratio Trapping (ART) is a way to realize non-silicon channels on a silicon substrate. In this technique, high aspect ratio trenches are created in between shallow trench isolation (STI) structures on silicon substrate. Fins made of III-V compound semiconductors are then formed in these trenches by selective epitaxial growth (SEG). The crystalline defects originating from the lattice mismatch are guided to the STI sidewalls and there trapped, which enable obtaining active regions with a small amount of defects. An aspect ratio greater than 1 is used in order to trap the crystalline defects.

It is a challenge, however, to produce III-V fins using the ART technique. Because ART uses SEG, the precursors used in SEG interact not only with the silicon substrate but also with the STI structures which are $SiO_2$. Such interactions could lead to the formation of defects in the STI structures, and such defects in turn degrade the electrical and structural reliability of the transistor.

Generally, defects formed in STI structures can be of two types. In-diffusion of the doping atoms, which are present in the SEG precursors, into the STI structures leads to the formation of a first type of defects, which are interstitial defects in $SiO_2$. Oxidation of these doping atoms at the surface of the STI structure leads to the formation of a second type of defects, which are oxygen vacancies in $SiO_2$ formed by depleting the oxygen from $SiO_2$.

One of the solutions to cope with the problem of defects is envisaged by improving the epitaxial quality of the ART process. However, this is a challenging task for the ART process as the ART technique is applied to grow non-Si semiconductor on Si substrate, where large lattice mismatch exists between the Si substrate and the non-Si semiconductor. Thus, crystalline defects may not be avoided, at least at the bottom of grown non-Si crystals.

Another alternative solution to cope with the problem of defects is to change the type of the doping present in the precursors. However, this can only change the extent of defectivity problem, but does not solve it effectively.

In, Al, Ga, P, As, Mg and Zn are the typical alternatives of species contained in the precursors.

Formation energies of the reactions, in which III-V atoms and doping atoms in the precursors move into the $SiO_2$, decreases during the course of the growth process as the precursors begin losing their organic ligands. This means that the thermodynamic driving force for the in-diffusion of III-V atoms and doping atoms increases.

Reaction enthalpies for the formation of native (sub) oxides as a result of the reaction of precursors with the oxygen of $SiO_2$ decreases during the course of the growth process. Formation of such native (sub) oxides is also not generally desired.

There is, therefore, a desire in the art to produce III-V fin structures using a method such that degradation of the device performance is avoided or reduced

SUMMARY OF THE DISCLOSURE

Embodiments of the present disclosure provide methods for producing a III-V fin structure within a gap of a semiconductor substrate, such as a silicon substrate. The III-V fin structure is made of a III-V compound semiconductor.

In a first aspect, the present disclosure provides a method for producing a III-V fin structure within a gap separating shallow trench isolation (STI) structures and exposing a semiconductor substrate. The method comprises providing a semiconductor substrate and, providing in this substrate, at least two identical STI structures separated by a gap exposing the substrate. This gap is bounded by these STI structures. In this gap, a III-V fin structure is produced. The method further comprises providing a diffusion barrier at least in contact with each side wall of these at least two identical STI structures and with side walls of this III-V fin structure.

In this example, providing a diffusion barrier to the STI structures helps to avoid the formation of defects in the STI structures during the production of III-V fin structures on a silicon substrate. Thus, the presence of such diffusion barrier provides electrical and structural reliability to the transistor.

It is a potential advantage of the embodiments of this disclosure that this method can be executed easily in the manufacturing environment.

It is another potential advantage of methods according to embodiments of the present disclosure that device performance may be improved by suppressing defect formation in STI structures during III-V fin production on a silicon substrate.

The device improvement can be seen as an improvement of the reliability of the device. As the oxygen vacancies in $SiO_2$ are minimized, device instabilities associated with these oxygen vacancies are thus reduced. These device instabilities can involve trap-assisted tunneling leakage and low-frequency noise. Reducing such device instabilities, in other words, improves the dynamic variability of the device contributing to the improvement of reliability. Additionally, positive bias temperature instability (PTBI), negative bias temperature instability (NBTI) and oxygen vacancy migrations will also be reduced. The device improvement can also be seen by a reduction in leakage current.

It is a potential advantage of the method according to embodiments of this method that is suited for ART technique, which is typically used for growing III-V fin structures on Si substrate.

In this respect, it is a potential advantage that methods according to embodiments of the present disclosure reduce, during the growth of III-V fin structures, in-diffusion of doping species into the STI structures, which in-diffusion is associated with the ART technique. Doping species are present in the precursors that are used to grow III-V fin structures.

Also, in this respect, it is further a potential advantage according to the embodiments of this disclosure that creation of oxygen vacancies in STI structures and subsequent formation of (sub) oxides at the surface of the STI structures, which is associated with the ART technique, during the growth of III-V fin structures is avoided.

It is a potential advantage of methods according to embodiments of the present disclosure that device performance is improved whereby carrier recombination at the III-V/STI interface is suppressed.

It is a potential advantage that methods according to embodiments of the present disclosure allow co-integration of different non-Si channel materials, for instance III-V compound semiconductors, and Ge with improved device performance.

It is a potential advantage that methods according to embodiments of the present disclosure allows to produce a semiconductor structure comprising III-V fin structures, suitable for producing a FinFET.

It is further a potential advantage of the embodiments of this method that it can be used to produce a FinFET comprising, or consisting of, III-V fin structures, as part of an integrated circuit.

In a method according to embodiments of the present disclosure, this III-V fin structure is produced by using Aspect Ratio Trapping (ART) technique.

In a method according to embodiments of the present disclosure, this diffusion barrier is an oxide comprising a metal.

In embodiments of the present disclosure, the metal of the diffusion barrier is aluminum or hafnium.

In embodiments of the present disclosure, this metal is aluminum. In embodiments of the present disclosure, this diffusion barrier is an aluminate, and providing this diffusion barrier comprises coating by Atomic Layer Deposition (ALD). This aluminate can be chosen from the group comprising $Al_2O_3$, HfAlO, TiAlO, YAlO, ZrAlO, or aluminates comprising a metal from the lanthanide-series of the periodic table. In one example, this aluminate is $Al_2O_3$.

In alternative embodiments of the present disclosure, the diffusion barrier is a metal silicate and, providing this diffusion barrier further comprises depositing the metal of the metal silicate using Molecular Beam Epitaxy (MBE) and performing subsequently a thermal anneal process. Depositing this metal and performing subsequently the thermal anneal process forms this metal silicate. If this metal is aluminum, an aluminum silicate is formed.

In embodiments of the present disclosure, this thermal anneal process is performed at a temperature less than 300° C. Performing this thermal anneal process at a temperature less than 300° C. is advantageous as it permits the formation of a metal silicate. Performing this thermal anneal process at a temperature higher than 300° C. leads to the formation of a silicide. It is may be disadvantageous to obtain silicide in the present disclosure.

In embodiments of the present disclosure, the diffusion barrier has a thickness between 0.5 nm and 50 nm. Preferably, the diffusion barrier has a thickness between 1 nm to 10 nm.

According to a particular embodiment, providing the at least two identical STI structures comprises forming at least two identical trenches in the semiconductor substrate. These trenches are separated by a portion of the semiconductor substrate. This portion has a pre-defined width. A dielectric material is deposited over the semiconductor substrate thereby filling these trenches. Planarizing this dielectric material exposes the top surface of this portion of the semiconductor substrate. Further recessing this exposed portion of the semiconductor substrate creates the gap.

In an embodiment, providing this diffusion barrier comprises coating this semiconductor substrate with this diffusion barrier before depositing this dielectric material.

In an alternative embodiment, providing this diffusion barrier comprises coating this semiconductor substrate with this diffusion barrier after recessing this portion.

According to a particular embodiment, the method further comprises, before producing the III-V fin structure, performing an etch process to expose at least the surface of the semiconductor substrate in between the STI structures.

In embodiments of the present disclosure, this etch process is an anisotropic dry etch thereby further exposing the top surfaces of the at least two identical STI structures. Performing this anisotropic dry etch process may be advantageous as it allows directional etching of the diffusion barrier. Hence, the diffusion barrier is removed from the surface of the semiconductor substrate in between the STI structures as well as from the top surfaces of the STI structures. As a result, the diffusion barrier remains only on the sidewalls of the at least two identical STI structures. Performing this anisotropic etch process may be advantageous when providing the diffusion barrier is done by coating using ALD.

In alternative embodiments of the present disclosure, this etch process is a metal etch using a hydrogen-based chemistry. Performing this metal etch using a hydrogen-based chemistry may be advantageous when coating the diffusion barrier is done by MBE. Using MBE leaves unreacted metal deposited in between the at least two identical STI structures. This metal etch using a hydrogen-based chemistry allows removal of the unreacted metal, thereby cleaning the surface of the semiconductor substrate in between the identical STI structures. In embodiments of the present disclosure, this metal etch process is a wet etch process.

In a second aspect of the present disclosure, a semiconductor structure is disclosed comprising a semiconductor substrate and at least two identical STI structures in this semiconductor substrate, separated by a III-V fin structure. These STI structures are coated at least on each side wall with a diffusion barrier. Side walls of this III-V fin structure are in contact with this diffusion barrier. This diffusion barrier is an oxide comprising a metal having a thickness in the range of 1 nm to 10 nm. This semiconductor structure is particularly suitable for producing a FinFET.

In a third aspect, the present disclosure relates to an integrated circuit comprising a semiconductor structure according to the second aspect.

DETAILED DESCRIPTION OF THE DISCLOSURE

Figure 1:
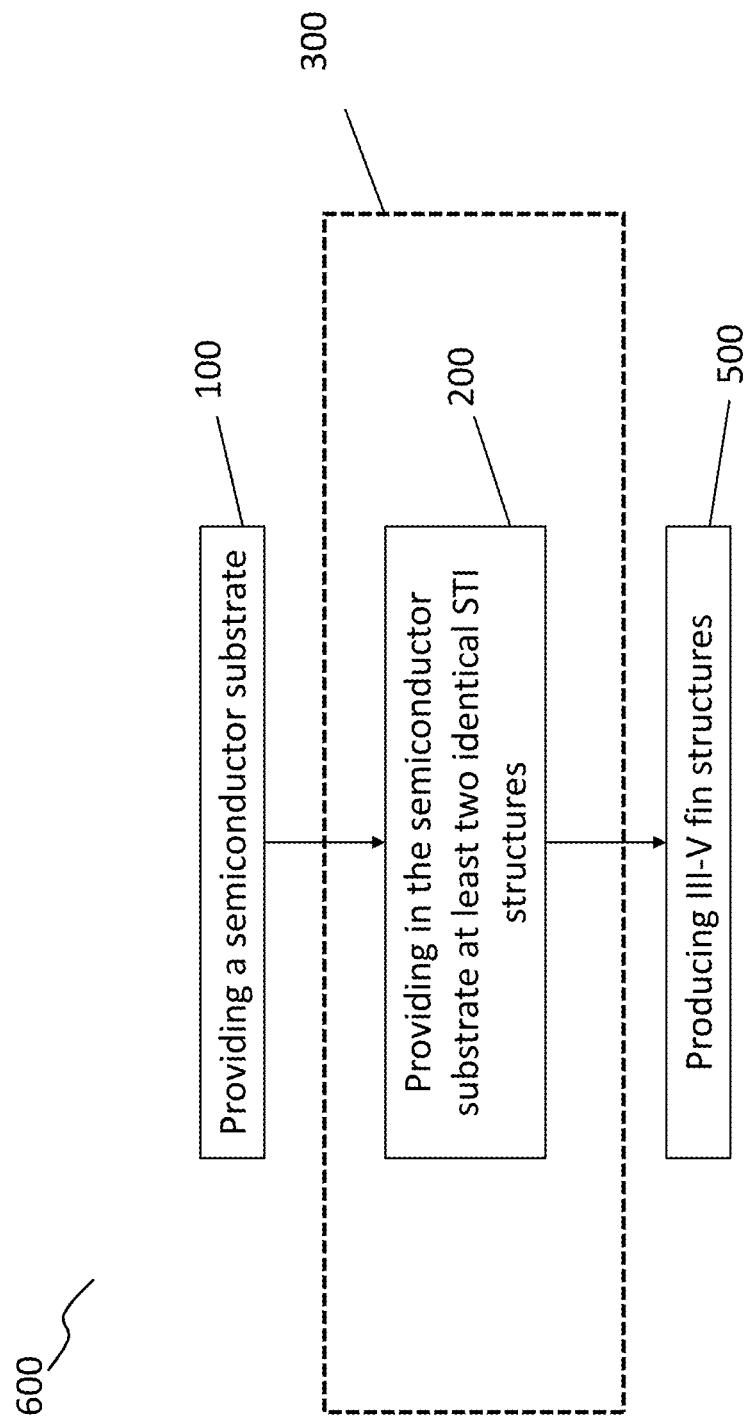
FIG. 1 is a flowchart representing a method according to an embodiment of the present disclosure.

The present disclosure will be described with respect to particular embodiments and with reference to certain drawings but the disclosure is not limited thereto but only by the claims. The drawings described are only schematic and are non-limiting.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary or example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "aspect ratio" refers to the depth to width ratio of a feature in question. The feature can be a trench or a structure.

As used herein and unless provided otherwise, the term "conformal" refers to a layer following the topography of the structure onto which it is deposited.

As used herein and unless provided otherwise, the term "anisotropic etching" refers to etching where the etch rate differs as a function of the direction. Consequently, for example, while material is removed from horizontal surfaces, no removal of material takes place from vertical surfaces.

The disclosure will now be described by a detailed description of several embodiments. It is clear that other embodiments of the disclosure can be configured according to the knowledge of a person skilled in the art without departing from the technical teaching of the disclosure, the disclosure being limited only by the terms of the appended claims.

FIG. 1 is a flowchart representing a method (600) according to embodiments of the present disclosure.

This method starts with providing a semiconductor substrate (100). Preferably, this semiconductor substrate is a silicon substrate. This silicon substrate can be a bulk Si substrate or silicon-on-insulator (SOI) substrate.

In a second step, at least two identical STI structures (4') are provided in the semiconductor substrate (200). These STI structures (4') are separated by a gap (11) exposing the semiconductor substrate.

In a third step (500), a III-V fin structure (5) is produced within this gap (11) on the exposed semiconductor substrate, wherein these STI structures are coated (300) with a diffusion barrier (3) at least on each side wall. Coating (300) these STI structures (4') with a diffusion barrier (3) at least on each side wall thereof helps to avoids the formation of defects in the STI structures during the growth of the III-V fin structure (5). More specifically, the presence of the diffusion barrier helps to eliminate the interaction of the precursors with the STI structures when, for example, ART technique is used to produce this III-V fin structure on silicon substrate (1) within this gap (11). In the ART technique, III-V crystals are grown on a Si surface in trenches bounded by STI structures, using a Metal Organic Vapor Phase Epitaxy (MOVPE) process. Precursors, typically used in MOVPE process, include Tri-methyl-In, Tri-methyl-Al, Tri-methyl-Ga, Tri-butyl-P, Tri-butyl-As, $Cp_2Mg$ or Di-ethyl-Zn.

Figure 2:
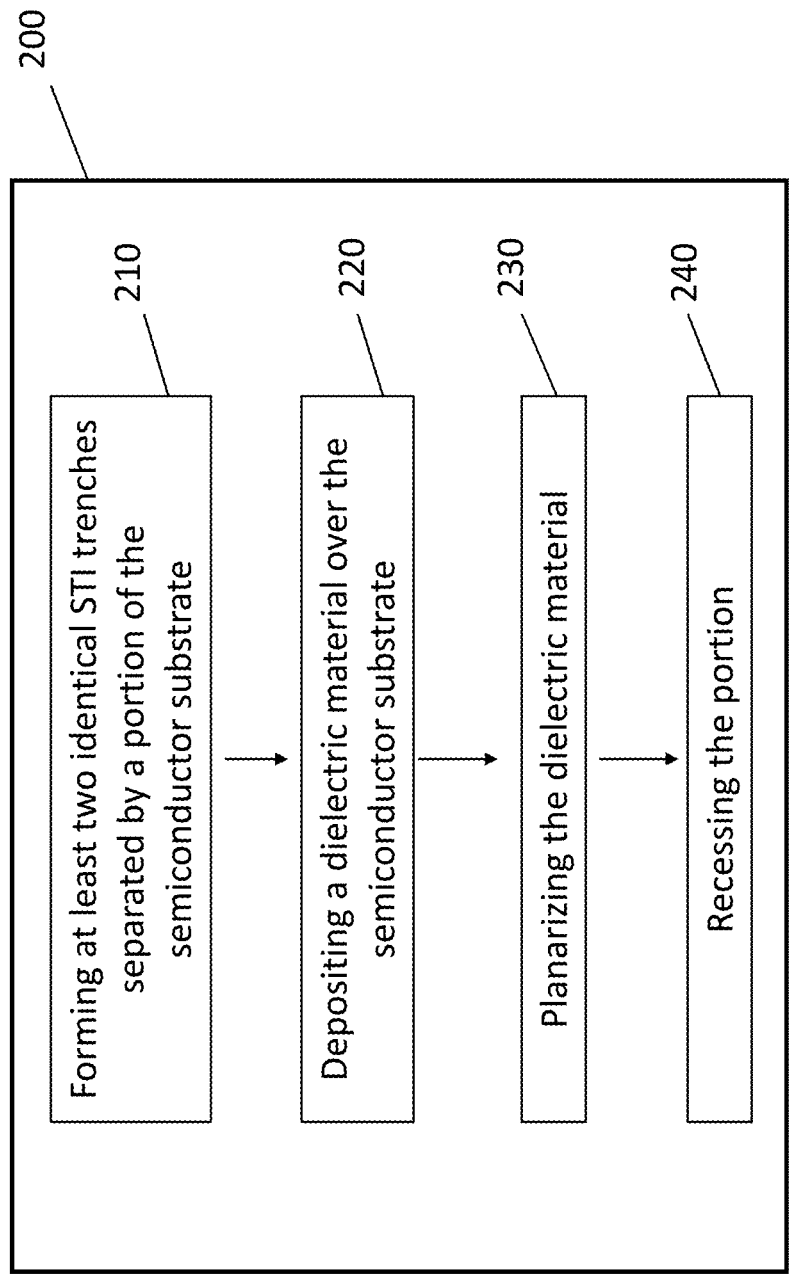
FIG. 2 is a flowchart representing a step of the method illustrated by FIG. 1, providing in the semiconductor substrate at least two identical STI structures separated by a gap exposing the semiconductor substrate.

FIG. 2 is a flowchart representing the step (200) of the method (600) illustrated by FIG. 1, of providing in the semiconductor substrate at least two identical STI structures separated by a gap exposing the semiconductor substrate. The STI structures are provided by forming (210) in the substrate at least two identical STI trenches (9), separated by a portion (10) of the semiconductor substrate. These STI trenches are formed by locally etching into the semiconductor substrate to a pre-defined depth thereby forming at that location a trench. Forming STI trenches by etching into the semiconductor substrate is known by persons skilled in the art. This pre-defined depth is in the range of 10 nm to 1000 nm. Preferably, this pre-defined depth is 250 nm.

The portion of the semiconductor substrate separating these STI trenches has a pre-defined width (x) and is in the form of a fin. As is illustrated in FIG. 4f and FIG. 6e, this portion (10) will be recessed, thereby creating a gap (11) separating the two identical STI structures (4'). In this gap the fin structure will then be formed. The pre-defined width (x) of this portion corresponds to the width of the fin structure that will be produced in the gap after the removal of this portion. In the context of the present disclosure, the pre-defined width (x) of this portion corresponds to the width of the III-V fin structure (5) that will be produced in the gap after recessing this portion. The pre-defined width (x) of this portion (10), which is corresponding to the width of the III-V fin structure (5), is in the range of 3 nm to 1000 nm. Preferably, the pre-defined width (x) of this portion corresponding to the width of the III-V fin structure (5) is in the range of 5 nm to 10 nm. This preferable pre-defined width (x) is the expected width in N7 technology node. N7 or in other words 7 nm node is the technology node following the 10 nm node. In general, the number given in the technology node in semiconductor industry refers to the minimum gate length of the transistor used in the corresponding technology. However, the minimum gate length can be, in reality, smaller than the technology node value.

In a second step (220), a dielectric material (4) is deposited over the semiconductor substrate, thereby filling these STI trenches (9). This dielectric material is preferably $SiO_2$, which can be deposited by techniques known to persons skilled in the art. Deposition of the dielectric not only fills the STI trenches but also results in an overgrowth layer (13).

In a third step (230), the dielectric material is planarized, thereby removing the overgrowth layer (13) until the top surface (12) of the portion (10) of the semiconductor substrate that separates the STI trenches is exposed.

In a fourth step (240), the portion (10) of the semiconductor substrate is recessed, thereby creating the gap (11). Recessing the portion (10) of the semiconductor substrate is done by a process known to persons skilled in the art. In the present disclosure, recessing this portion of the semiconductor substrate is done such that the gap is bounded by the STI structures (4'). Recessing of the portion of the semiconductor substrate is done to a depth such that the aspect ratio of the gap is greater than 1. Having the aspect ratio of the gap greater than 1, permits the use of ART technique to produce III-V fin structures on Si substrate. The depth of this gap is between 10 nm to 1000 nm. Preferably, this depth is 200 nm.

Figure 3:
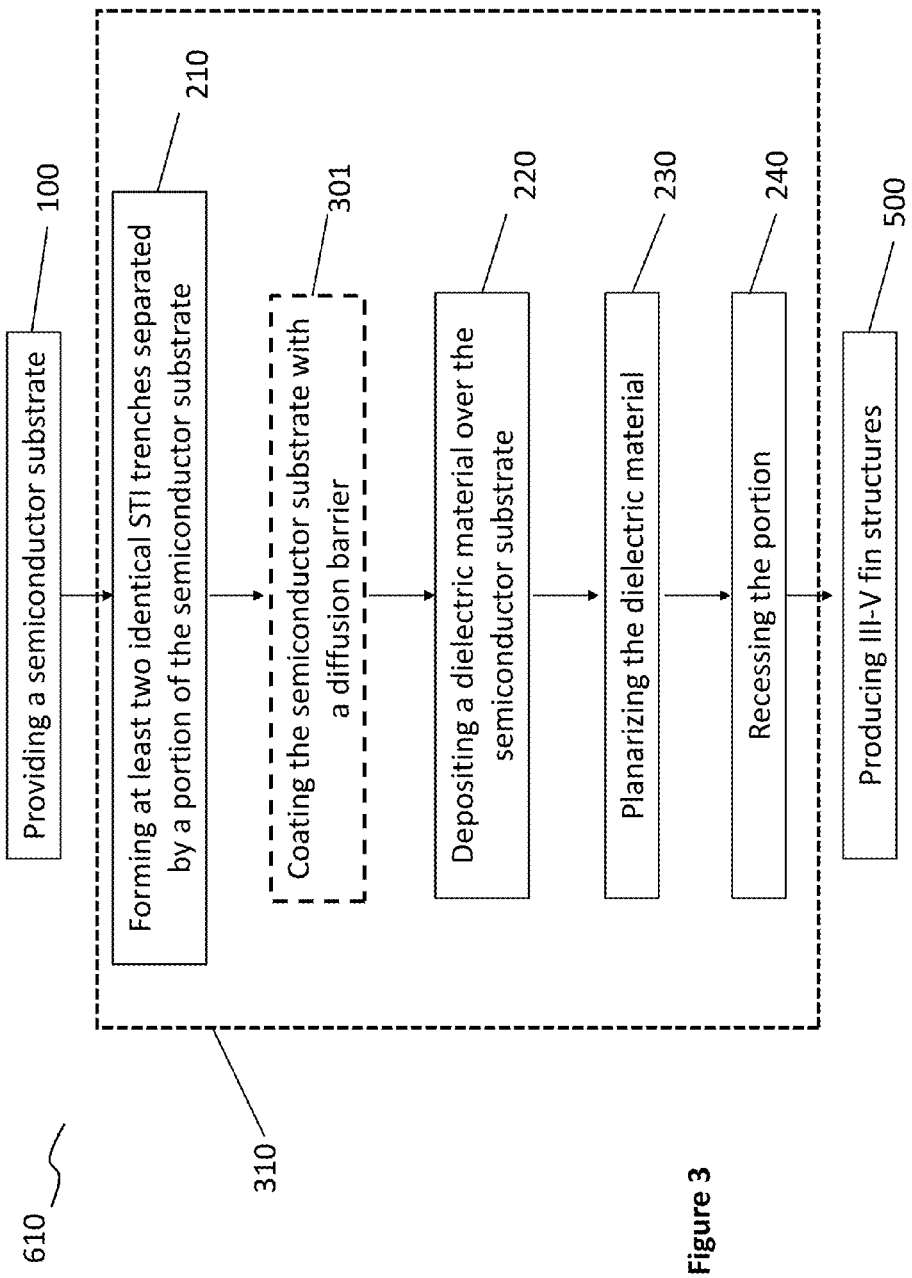
FIG. 3 is a flowchart representing a method according to a particular embodiment of the method represented in the flowchart of FIG. 1, where providing the diffusion barrier is subsequently done after forming at least two identical STI trenches.

FIG. 3 is a flowchart representing a method according to a particular embodiment of the first aspect of the present disclosure represented in the flowchart of FIG. 1.

The method (610) starts, in a first step, with providing (100) a semiconductor substrate (1). Preferably, this semiconductor substrate is a silicon substrate. This silicon substrate can be a bulk Si substrate or silicon-on-insulator (SOI) substrate.

In a second step (310), in the substrate, a diffusion barrier (3) is provided at least on each side wall of STI structures (4'). This second step (310) comprises providing in the semiconductor substrate at least two identical STI structures (200), whereby this second step (310) comprises the steps ((210), (220), (230) and (240)) as outlined in FIG. 2. In this particular embodiment, providing this diffusion barrier in this second step (310) comprises coating (301) the semiconductor substrate (1) with the diffusion barrier (3) before depositing (220) the dielectric material (3) over the semiconductor substrate.

In the third and last step (500), III-V fin structures (5) are produced in-between these STI structures (4').

In an alternative embodiment, providing this diffusion barrier in this second step (310) comprises coating (301) the semiconductor substrate (1) with the diffusion barrier (3) after recessing the portion.

FIGS. 4a to 4g illustrate process steps used to realize the particular embodiment represented by the flowchart in FIG. 3.

Figure 4A:
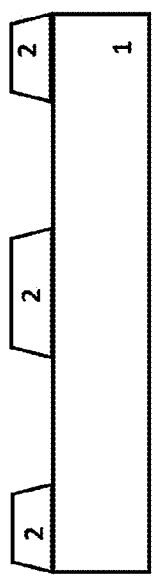
FIGS. 4a to 4g show schematically a process flow for producing a III-V fin structure according to a particular embodiment of the method represented in the flowchart of FIG. 3.
Figure 4B:
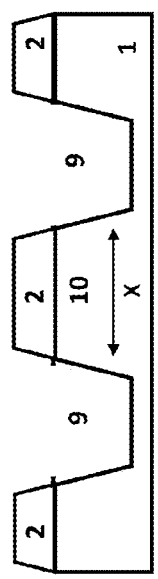

FIGS. 4a and 4b illustrate forming the STI trenches (9) in the semiconductor substrate (1). These figures will be explained in more detail.

Forming these STI trenches (9) in the semiconductor substrate (1) comprises patterning the semiconductor substrate and etching into the semiconductor substrate. Patterning the semiconductor substrate comprises depositing on the semiconductor substrate a mask layer (not shown in the figure). This mask layer is a silicon nitride layer. A photo-resist is deposited on this mask layer (not shown in the figure). After performing a lithography step, this mask layer is etched. Performing a strip process removes the photoresist layer thereby creating patterned mask features (2) (FIG. 4a). The semiconductor substrate (1) can be patterned using a multiple patterning technique including double patterning, Self-Aligned Double Patterning (SADP) or Self-Aligned Quadruple Patterning (SAQP). The semiconductor substrate can also be patterned using Directed Self Assembly (DSA). The semiconductor substrate is etched using these patterned mask features thereby creating the STI trenches (9) in the semiconductor substrate (1) (FIG. 4b). These STI trenches (9) are separated by a portion (10) of the semiconductor substrate having a pre-defined width (x).

Figure 4C:
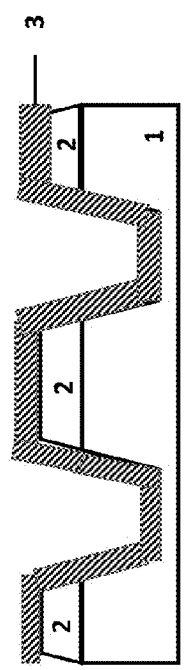

In FIG. 4c, the semiconductor substrate is coated with the diffusion barrier (3). This diffusion barrier (3) has a thickness between 0.5 nm and 50 nm. Preferably, this diffusion barrier has a thickness between 1 nm and 10 nm.

This diffusion barrier is an oxide comprising a metal.

This metal is hafnium or preferably, aluminium. In the case where aluminium is used as the metal, the metal-comprising oxide can be an aluminate. This aluminate can be chosen from the group comprising $Al_2O_3$, HfAlO, TiAlO, YAlO, ZrAlO or aluminates comprising a metal from the lanthanide-series of the periodic table. Preferably, the aluminate is $Al_2O_3$.

The diffusion barrier is preferably amorphous as grain boundaries are absent in the amorphous phase.

The diffusion barrier preferably has an atomic density higher than that of $SiO_2$, which makes up the STI structures. A higher atomic density generally means a denser structure with less open spaces indicating a higher barrier for diffusion of dopants.

Additionally, stronger metal-oxide bonds in the diffusion barrier than those of Si—O bonds of $SiO_2$ reduces the tendency to form oxygen vacancies. Strong bonds lead to a high cohesive energy and hence, to a high melting or a high crystallization temperature. Therefore, having a higher atomic density and stronger bonds than that of $SiO_2$ are crucial features in order to qualify as a diffusion barrier within the context of the present disclosure.

The crystallization temperature of the diffusion barrier is preferably in the range 500° C. to 2000° C. More preferably, the crystallization temperature of this diffusion barrier is in the range 800° C. to 1200° C.

The diffusion barrier has a relatively large band gap. The motivation for having a relatively large band gap is to prevent the current flow through the diffusion barrier. Current flow is linked to the carrier mobility. The diffusion barrier with a relatively large band gap thus has reduced carrier mobility, thereby reducing the current flow through it. The diffusion barrier preferably has a band gap in the range 1 to 15 eV given at 300 K. More preferably, this band gap is in the range 5 to 9 eV given at 300 K.

When aluminate (6) is chosen as the diffusion barrier, coating is done by Atomic Layer Deposition (ALD). It is known in the art that ALD provides conformal deposition. Hence, this aluminate diffusion barrier will be conformal having a uniform thickness.

The metal-comprising oxide can also be a metal silicate. When a metal silicate (7) is chosen as the diffusion barrier, coating further comprises depositing the metal using Molecular Beam Epitaxy (MBE), and performing subsequently a thermal anneal process, leading to the formation of this metal silicate. Thus, in an embodiment governed by FIG. 4, this diffusion barrier (3) can be deposited either by ALD or by MBE. This thermal anneal process is performed at a temperature less than 300° C. Performing this thermal anneal process at a temperature less than 300° C. may be advantageous since it leads to the formation of a metal silicate. Metal silicate is a compound comprising an anionic silicon compound. The metal of this metal silicate can be chosen from the group comprising Al, Hf, Ti, Y, Zr, or metals from the lanthanide-series of the periodic table. This metal silicate is preferably, aluminium silicate and has the formula $Al_2SiO_5$. Performing this thermal anneal process at a temperature higher than 300° C. is however, not advantageous. This is due to the fact it leads to the formation of a silicide. Silicide is an alloy of a metal with Si. In the case where aluminum is used as the metal, annealing at a temperature higher than 300° C. thus, leads to the formation of aluminum silicide. It is disadvantageous to obtain silicide in the present disclosure because removal of silicide from the surface of the semiconductor substrate is difficult.

Figure 4D:
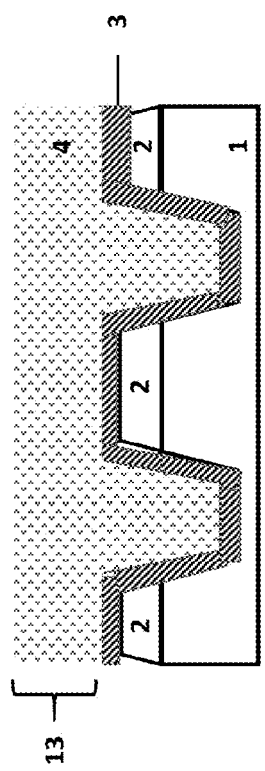

In FIG. 4d, a dielectric material (4) is deposited over the semiconductor substrate, thereby filling the STI trenches. This dielectric can be $SiO_2$. Deposition of this dielectric not only fills these STI trenches but also results in an overgrowth layer (13). This overgrowth layer thus covers the diffusion barrier (3).

Figure 4E:
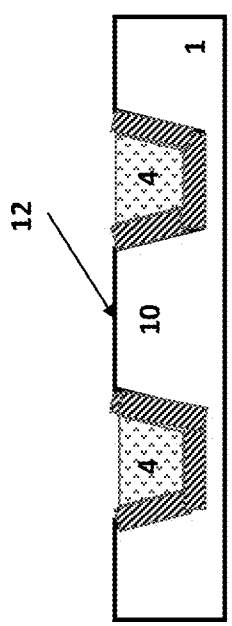
Figure 4F:
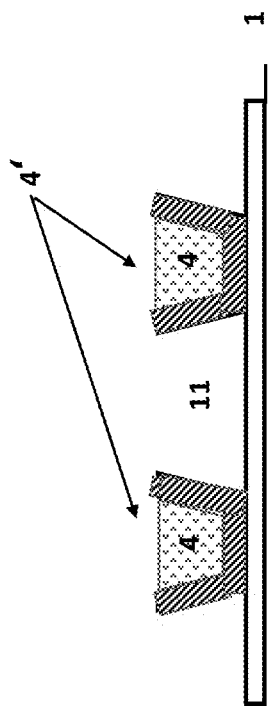

In FIG. 4e, this dielectric is planarized by using Chemical Mechanical Planarization (CMP). As a result of CMP, this overgrowth layer (13) of the dielectric is removed. CMP is carried out until patterned mask features (2) are also removed such that the top surface (12) of the portion (10) of the semiconductor substrate (1) is exposed.

In FIG. 4f, this portion of the semiconductor substrate is recessed, thereby creating a gap (11). As a result of recessing this portion (10) of the substrate, STI structures (4') become free-standing. These STI structures have the diffusion barrier on their side walls and at the bottom surfaces. When a plurality of STI structures (4) is to be produced, a gap like to the one (11) shown in FIG. 4f will be created to the left and to the right of these STI structures (4) after recessing the semiconductor substrate.

Figure 4G:
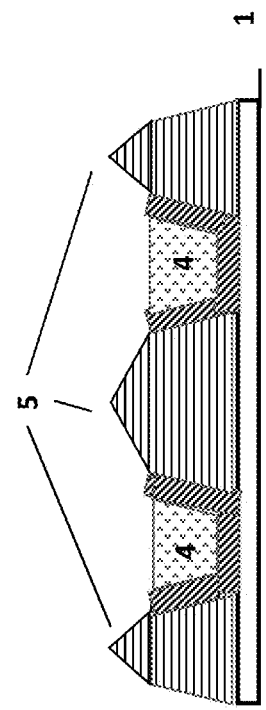

In FIG. 4g, a III-V fin structure (5) is produced within the gap (11) on the exposed semiconductor substrate. When a plurality of STI structures is produced, an identical III-V fin structure (5) is also produced within the gap present to the left and to the right of the STI structures (4) shown in FIG. 4g.

Figure 5:
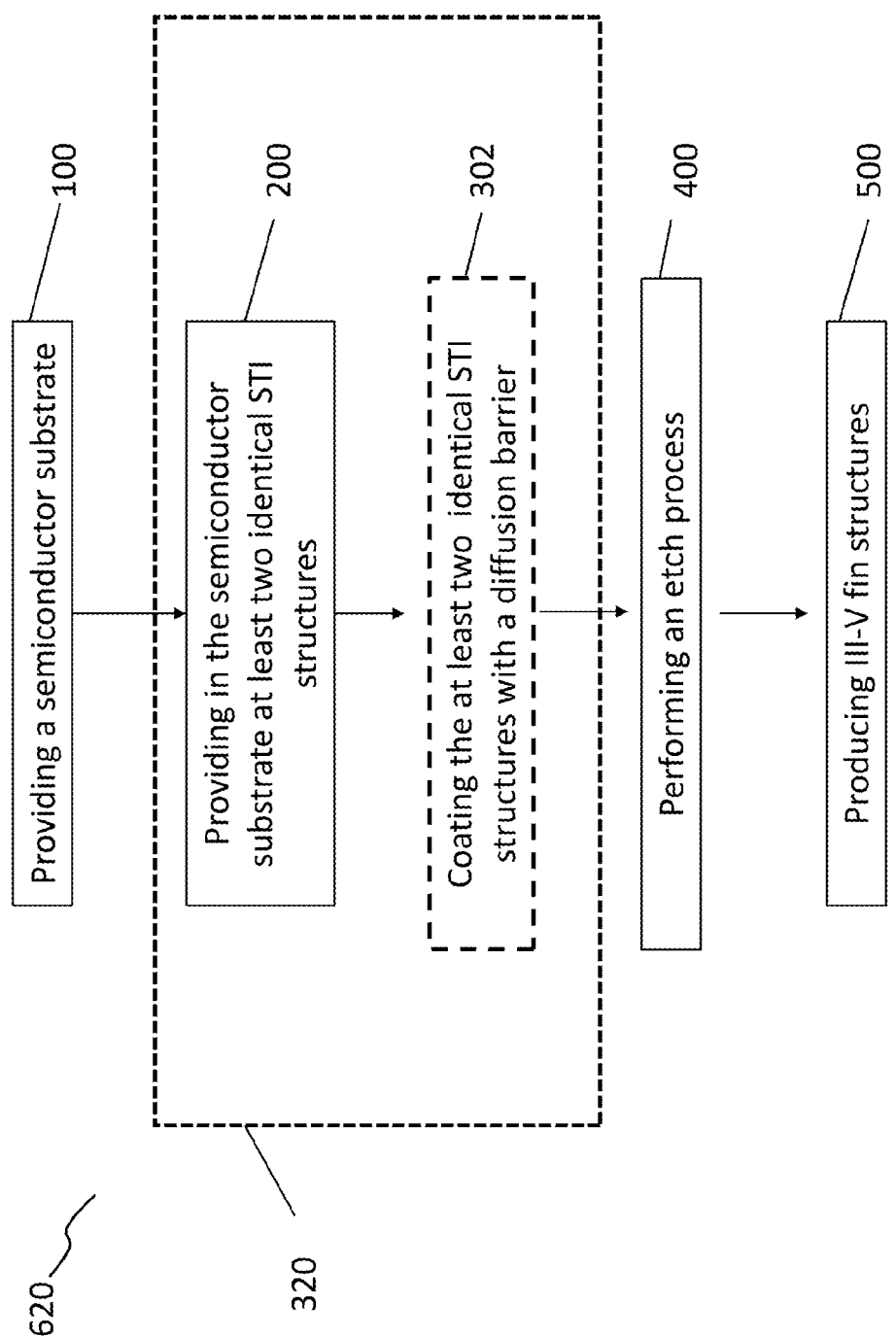
FIG. 5 is a flowchart representing a method according to a particular embodiment of the method represented in the flowchart of FIG. 1, where providing in the semiconductor substrate at least two identical STI structures is subsequently followed by coating the at least two identical STI structures with a diffusion barrier and performing an etch process.

FIG. 5 is a flowchart representing a method according to a particular embodiment of the method represented in the flowchart of FIG. 1.

The method (620) starts, in a first step, with providing (100) a semiconductor substrate. Preferably this semiconductor substrate is a silicon substrate. This silicon substrate can be a bulk Si substrate or silicon-on-insulator (SOI) substrate.

In a second step (320), a diffusion barrier (3) is provided at least on each side wall of STI structures (4'). The second step (320) comprises providing (200) in the semiconductor substrate these STI structures (4'), which involves steps ((210), (220), (230) and (240)) as outlined in FIG. 2. The second step (320) further comprises coating (302) these STI structures with a diffusion barrier.

In the third step (400) an etch process is performed.

In the fourth and final step (500) a III-V fin structure (5) is produced.

FIGS. 6a to 6e illustrate process steps used to provide in the semiconductor substrate these STI structures realized by the particular embodiment represented by the flowchart in FIG. 5.

Figure 6A:
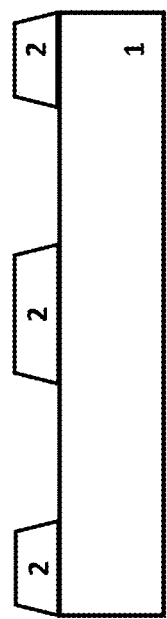
FIGS. 6a to 6e show schematically a process flow for producing at least two identical STI structures according to a particular embodiment of the method represented in the flowchart of FIG. 5.

FIG. 6a shows a semiconductor substrate (1). A mask layer is deposited on the semiconductor substrate (not shown in the figure). This mask layer is a silicon nitride layer. A photoresist is deposited on this mask layer (not shown in the figure). After performing a lithography step, this mask layer is etched. Performing a strip process removes the photoresist layer, thereby creating patterned mask features (2).

The semiconductor substrate (1) can be patterned using a multiple patterning technique including double patterning, Self-Aligned Double Patterning (SADP) or Self-Aligned Quadruple Patterning (SAQP). The semiconductor substrate can also be patterned using Directed Self Assembly (DSA).

Figure 6B:
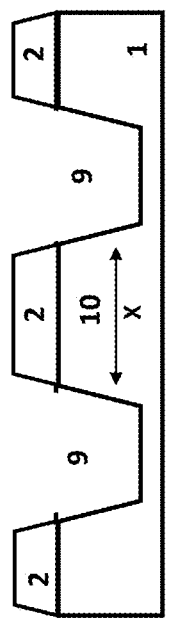

As shown in FIG. 6b, these patterned mask features (2) protect the semiconductor substrate during pattern transfer in the semiconductor substrate (1), whereby the pattern transfer is done by etching. Etching leads to the formation of STI trenches (9) in the semiconductor substrate (1). These STI trenches (9) are separated by a portion (10) of the semiconductor substrate having a pre-defined width (x).

Figure 6C:
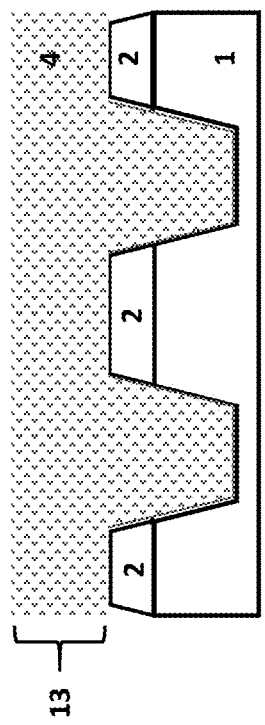
Figures 6D, 6E:
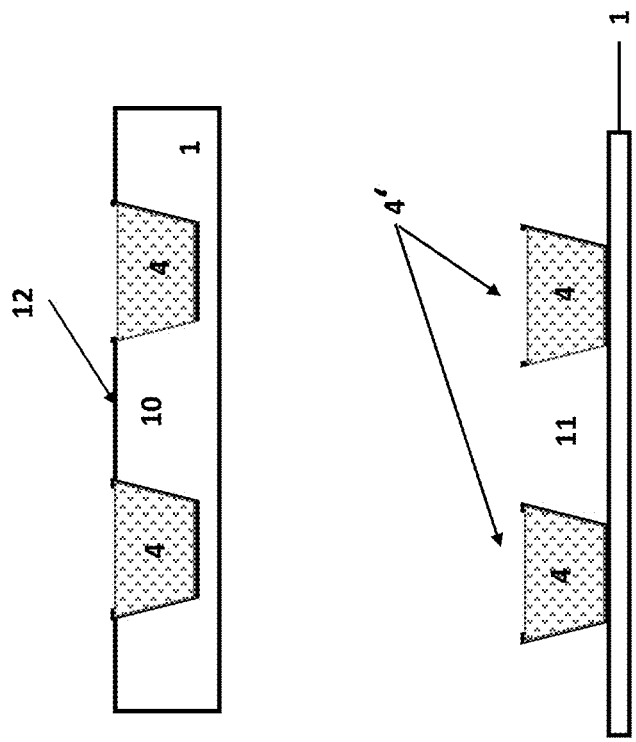

In FIG. 6c, a dielectric material (4) is deposited over the patterned semiconductor substrate. This dielectric material fills these STI trenches (9). This dielectric material can be $SiO_2$. Deposition of this dielectric not only fills the STI trenches but also results in an overgrowth layer (13). The overgrowth layer also covers the patterned mask features (2).

In FIG. 6d, this dielectric material is planarized until the top surface (12) of the portion (10) of the semiconductor substrate (1) is exposed. Planarization of this dielectric is done by Chemical Mechanical Planarization (CMP).

In FIG. 6e, this portion (10) of the semiconductor substrate (1) is recessed, leading to the formation of a gap (11). When a plurality of STI structures (4) is to be produced, a gap identical to the one (11) shown in FIG. 6e will be created to the left and to the right of these STI structures (4) after recessing the semiconductor substrate.

Figure 7A:
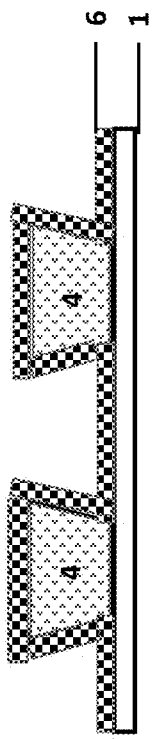
FIGS. 7a to 7c show schematically a first example of coating the at least two identical STI structures according to a particular embodiment of the method represented in the flowchart of FIG. 5.
Figure 7B:
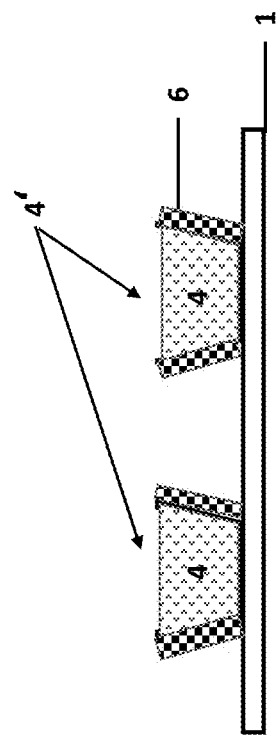
Figure 7C:
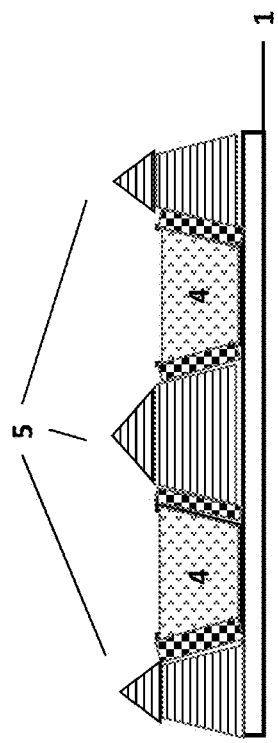

FIGS. 7a to 7c show schematically a first example of coating these at least two identical STI structures according to a particular embodiment of the method represented in the flowchart of FIG. 5.

FIG. 7a illustrates conformal coating of these STI structures (4') by the diffusion layer (6). When the metal-comprising oxide diffusion barrier is an aluminate (6), coating is done by Atomic Layer Deposition (ALD) leading to conformal deposition. This aluminate can be chosen from the group comprising $Al_2O_3$, HfAlO, TiAlO, YAlO, ZrAlO, or aluminates comprising a metal from the lanthanide-series of the periodic table. Preferably, this aluminate is $Al_2O_3$.

In order to produce III-V fin structures, the surface of the semiconductor substrate should be free of this diffusion barrier. Therefore, an etch process is performed as illustrated in FIG. 7b. When this diffusion barrier is deposited by ALD, the etch process is an anisotropic dry etch process. This anisotropic dry etch process removes this diffusion barrier both from the top of STI structures (4') and from the surface of the semiconductor substrate (1), which is in between these STI structures. Typical, etching gases such as $CHF_3$ or $CF_4$ in combination with Cl-containing or oxygen-containing atmosphere are used to perform this anisotropic dry etch process. As observed in FIG. 7(b), the diffusion barrier remains only on the sidewalls of these STI structures after the completion of this anisotropic etch process.

In the next step, as shown in FIG. 7c, a III-V fin structure (5) is produced within the gap (11) on the semiconductor substrate (1). When a plurality of STI structures is produced, an identical III-V fin structure (5) is also produced within the gap present to the left and to the right of the STI structures (4) shown in FIG. 7c.

Figure 8A:
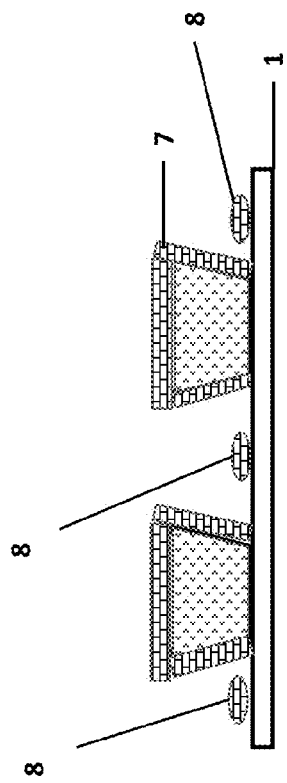
FIGS. 8a to 8c show schematically a second example of coating the at least two identical STI structures according to a particular embodiment of the method represented in the flowchart of FIG. 5.
Figure 8B:
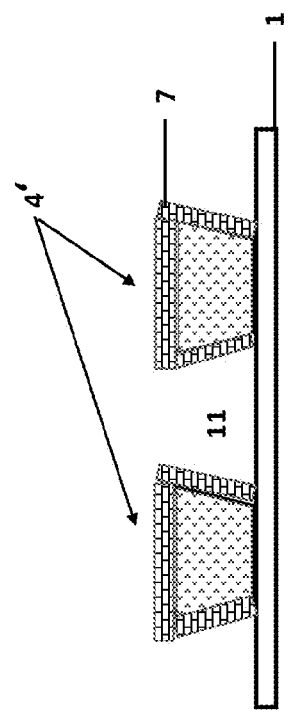
Figure 8C:
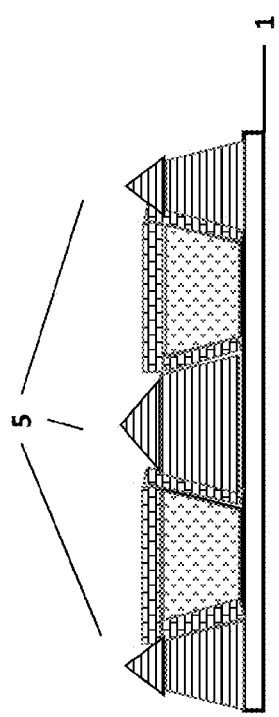

FIGS. 8a to 8c show schematically a second example of coating these at least two STI structures according to a particular embodiment of the method represented in the flowchart of FIG. 5. When a metal silicate (7) is chosen as the diffusion barrier, coating is done by Molecular Beam Epitaxy (MBE). The metal silicate is an aluminum silicate having the formula $Al_xSi_{(1-x)}O_z$. Preferably, this aluminum silicate is $Al_2SiO_5$. Aluminum in solid phase is installed in the MBE chamber. During the MBE process, aluminum is evaporated and evaporated aluminum interacts with the wafer. Depending on the atmospheric pressure of flow of aluminum, the thickness of the metal silicate can be thicker on top of the STI structures compared to the thickness on the side walls. However, this will not pose a problem to the functioning of the metal silicate as a diffusion barrier.

During MBE, diffusion of metal into STI structures takes place. Subsequent to the MBE process, a thermal anneal process is done, thereby forming this metal silicate on the top and sidewalls of the STI structures (4') as shown in FIG. 8a. This thermal anneal process is performed at a temperature less than 300° C. Performing this thermal anneal process at a temperature less than 300° C. is beneficial because it leads to the formation of a metal silicate. Performing this thermal anneal process at a temperature higher than 300° C. leads to the formation of a silicide. Silicide is an alloy of a metal with Si and it is disadvantageous to obtain silicide in the present disclosure. Removal of silicide from the semiconductor substrate is difficult, therefore its formation is avoided by performing the thermal anneal process at a temperature less than 300° C.

Due to the unreacted metal (8) present on the semiconductor substrate (FIG. 8a) after completing the MBE process, it is necessary to perform an etch process in order to end up with a clean the semiconductor substrate as shown in FIG. 8b. This etch process is also referred to as a silicon surface cleaning process since it removes unreacted metal residues (8) from the semiconductor substrate. This etch process is a metal etch process and is done using a hydrogen-based chemistry. This metal etch process is a wet etch process. It is advantageous to use a wet etch process to remove the unreacted metal residues because since this wet etch process suppresses the damage of etching. The hydrogen-based chemistry used in this metal etch process comprises hydrogen chloride (HCl) or sulphuric acid ($H_2SO_4$).

Following this etch process, a III-V fin structure (5) is produced within this gap (11) on the semiconductor substrate (1) as shown in FIG. 8c. When a plurality of STI structures is produced, an identical III-V fin structure (5) is also produced within the gap present to the left and to the right of the STI structures (4) shown in FIG. 8c.

In a method according to embodiments of this disclosure, this diffusion barrier is provided at least on the sidewalls of these STI structures (4). In this case, these STI structures are in contact with the semiconductor substrate. This diffusion barrier may also be provided on top and at the bottom of these STI structures as shown in FIG. 4(e) or FIG. 7(a). When this diffusion barrier is also provided at the bottom of these STI structures, this diffusion barrier is, then, in between and in contact with these STI structures and the semiconductor substrate.

In a method according to embodiments of this disclosure, a III-V fin structure is produced within a gap separating these STI structures that exposes the semiconductor substrate. This fin structure protrudes from the surface level of the STI structures. Thus, the portion of the fin structures that protrude from the surface level of the STI structures are not coated by this diffusion barrier. Therefore, only the side walls (of the portion) of the fin structures, which are bounded by these STI structures, are in contact with this diffusion barrier.

Figure 9:
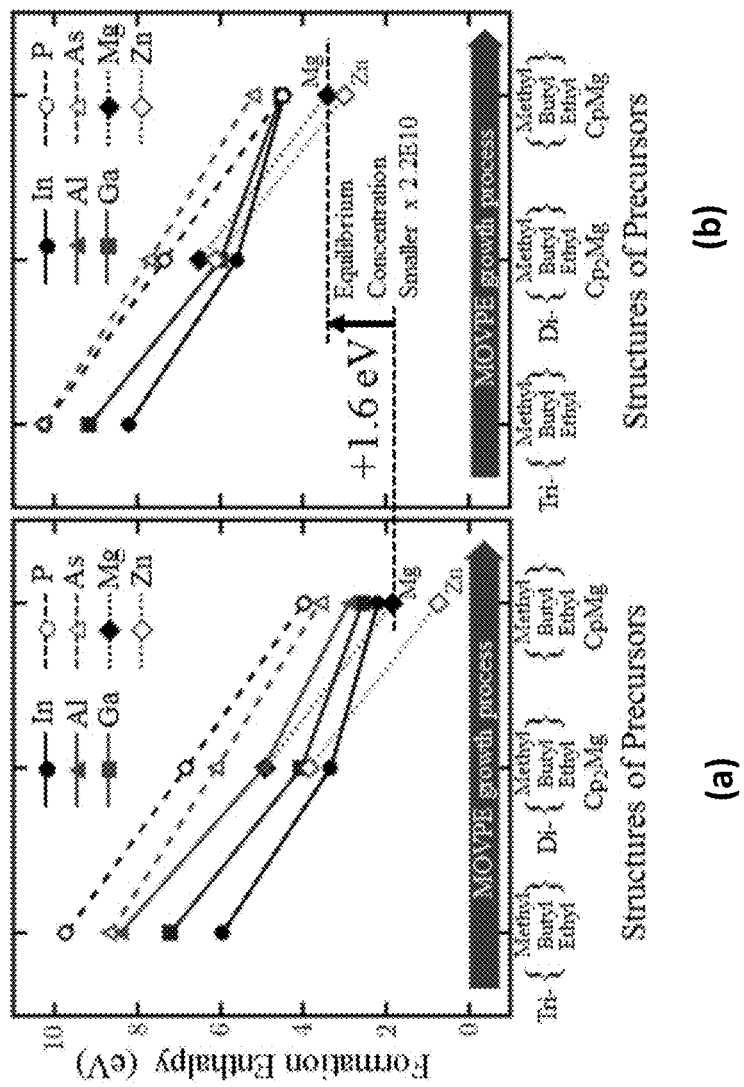
FIG. 9 illustrates a comparison of the evolution of formation energy for the diffusion of different doping species in the case of (a) only STI ($SiO_2$) and (b) with $Al_2O_3$ diffusion barrier.

FIG. 9 shows a comparison of the calculated enthalpy of formation energies of the reactions for the injection of the species, which are present in III-V precursors, into the STI structures. STI structure is formed of $SiO_2$ in FIG. 9a, while the STI structure is formed of $Al_2O_3$ in FIG. 9b. The transverse axis in FIG. 9a and FIG. 9b shows the evolution of the structures of the precursors during MOVPE process. A tri-methyl, tri-butyl or tri-ethyl molecule, which is bound to one of the elements such In, Al, Ga, P, As, Mg, or Zn, is used as a precursor. During the MOVPE process one of the methyl groups is lost leading to the formation of di-methyl, di-butyl or di-ethyl. Further on during the MOVPE process, they become methyl, butyl or ethyl after losing still another methyl group. A Mg precursor, for example such as $Cp_2Mg$, becomes a CpMg during the MOVPE process. A low value of enthalpy of formation energy shows that the reaction occurs easily indicating that the element in question is keen to be injected into the STI structure.

Comparison of the graph shown in FIG. 9a ($SiO_2$—STI) and in FIG. 9b ($Al_2O_3$—STI) shows the difference of the formation enthalpies. It is observed that there is 1.6 eV difference in enthalpy of formation energy of Mg in $SiO_2$ in comparison to that in $Al_2O_3$. As also shown in FIG. 9, it is estimated that the concentration of the interstitial Mg, for example, in $Al_2O_3$ is 2.2e10 times smaller than that in $SiO_2$. This means that $Al_2O_3$ has a potential to block the diffusion of dopant species and especially Mg as shown in this example.

Figure 10:
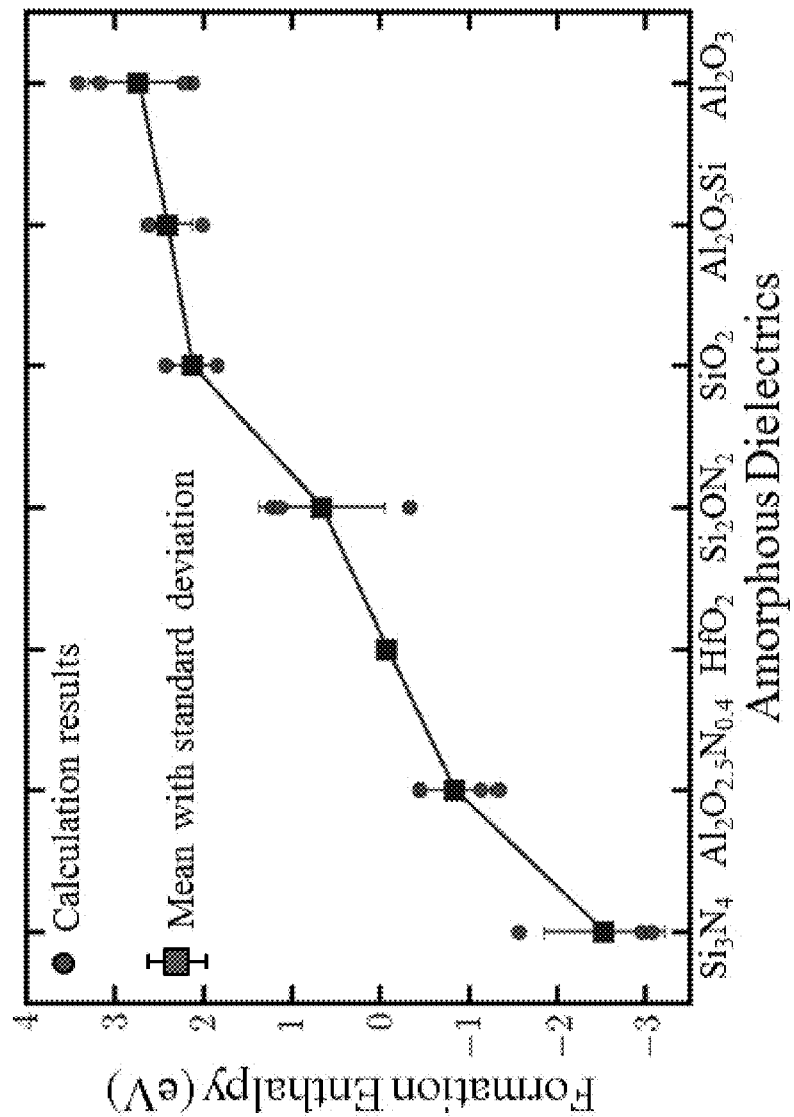
FIG. 10 illustrates formation energy for the diffusion of Mg when different amorphous dielectrics are used as diffusion barrier.

FIG. 10 illustrates enthalpy of formation energy of Mg for different amorphous dielectric materials investigated, which can be used as diffusion barrier. These amorphous dielectric materials include aluminates such as $Al_2O_{2.5}N_{0.4}$, $Al_2O_3$, metal silicate such as $Al_2SiO_5$ as well as other alternative amorphous dielectrics such as $Si_3N_4$, $HfO_2$, $Si_2ON_2$. As noted earlier being amorphous is an advantage for the dielectric that will be used as the diffusion barrier. One of the advantages of amorphous versus polycrystalline phases is the absence of grain boundaries in the amorphous phase. Grain boundaries are preferential paths for enhanced diffusion. Thus, the absence of grain boundaries is an asset of amorphous layers. In addition to that, the amorphous phase does not require a high crystallization temperature, which gives the device less thermal stress.

The graph given in FIG. 10 shows the calculated value of the enthalpy of formation energy of Mg (denoted by circles) for each amorphous dielectric material investigated. Due to the fact that an amorphous structure has a number of interstitial sites, a variation in the enthalpy of formation energy is obtained. If the value of the enthalpy of formation energy of Mg is higher than zero eV, this indicates a less likelihood of Mg to be injected into the STI structure. In this respect, for example, the top two candidates to be used as a diffusion barrier can be $Al_2SiO_5$ or $Al_2O_3$.

Figure 11:
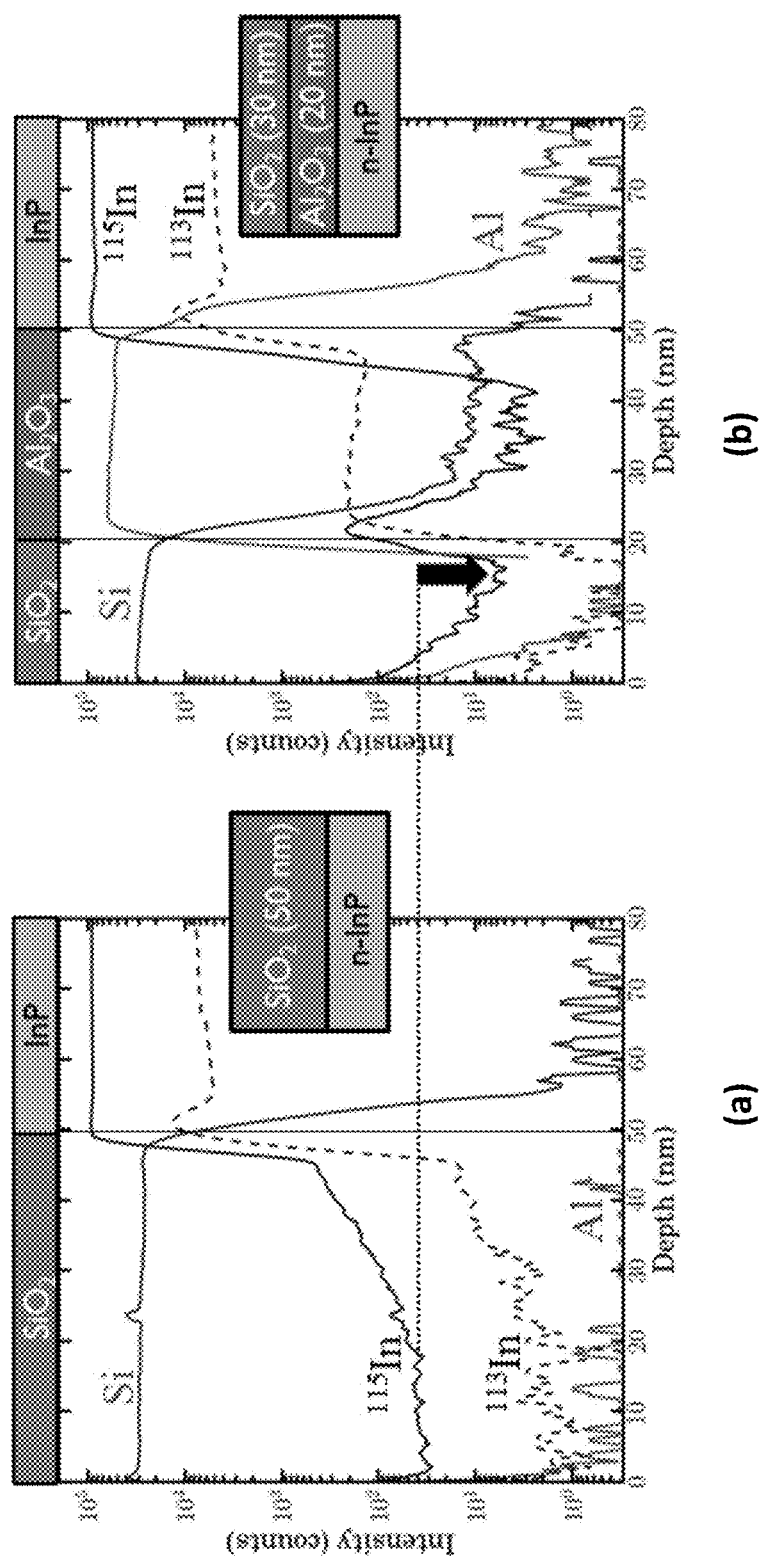
FIG. 11 illustrates the depth profiles of Si, Al and In obtained by Secondary Ion Mass Spectroscopy (SIMS).

FIG. 11 shows the depth profiles of Si, Al and In obtained by Secondary Ion Mass Spectroscopy (SIMS) when $SiO_2$ is deposited on n-type InP (FIG. 11a) or when a bilayer of $SiO_2/Al_2O_3$ is deposited on n-type InP (FIG. 11b). The thickness of $SiO_2$ in FIG. 11a is 50 nm. In FIG. 11b, a bilayer of 30 nm $SiO_2$ on 20 nm $Al_2O_3$ is used. It should be noted that the In signal in the $Al_2O_3$ region, shown in FIG. 11b, corresponding to a depth of 20 nm −50 nm, can be difficult to understand. This is because of the presence of interference between In and the secondary ions of $Al_2O_3$. However, comparison of the intensity of In at a depth of 15 nm shows that the sample with $Al_2O_3$, presented in FIG. 11b, has 10 times smaller intensity of In $SiO_2$ than that presented in FIG. 11a at the same depth value of 15 nm. This indicates a reduced diffusion of In from InP substrate into $SiO_2$ when $Al_2O_3$ is used as the diffusion barrier.

Figure 12:
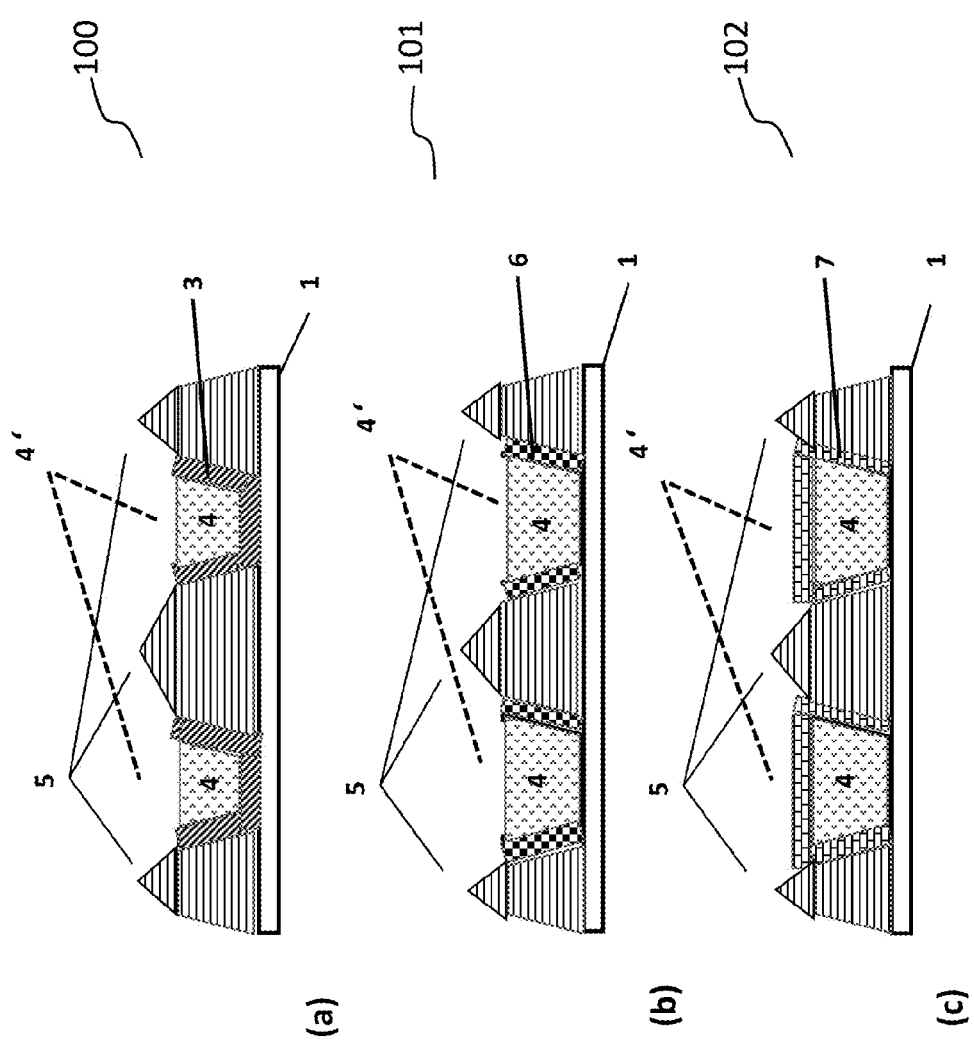
FIG. 12 illustrates semiconductor structures obtained according to methods of the present disclosure.

FIG. 12 shows different semiconductor structures (100, 101, 102) obtained by using methods disclosed in embodiments of the present disclosure. These semiconductor structures comprise a semiconductor substrate (1). This semiconductor substrate is a Si substrate. On this Si semiconductor substrate there are at least two identical STI structures (4'). Depending on how these STI structures are formed, the diffusion barrier can be present not only on the sidewalls (FIG. 12b) but also on the top (FIG. 12c) or at the bottom (FIG. 12c) of the STI structure. When this diffusion barrier is also present at the bottom of these STI structures, this diffusion barrier is, then, in between and in contact with these STI structures and the semiconductor substrate. III-V fin structures (5) are present in between these STI structures. The portion of the fin structures that protrude from the surface level of the STI structures are not coated by this diffusion barrier. Thus, only the side walls (of the portion) of the fin structures, which are bounded by these STI structures, are in contact with this diffusion barrier. It is also illustrated in FIG. 12a-c that the side walls of the III-V fin structures (5) are in contact with the diffusion barrier present on the side walls of the STI structures (4'). Furthermore, these III-V fin structures (5) are bounded by these STI structures (4').

What is claimed is:

1. A method for producing a III-V fin structure within a gap separating shallow trench isolation (STI) structures and exposing a semiconductor substrate, the method comprising:
    providing a semiconductor substrate, wherein the semiconductor substrate is a Si substrate;
    providing in the semiconductor substrate at least two identical STI structures separated by a gap exposing the semiconductor substrate, wherein the gap is bounded by the at least two identical STI structures, wherein the at least two STI structures are SiO2;
    producing a III-V fin structure within the gap on the exposed semiconductor substrate using a Metal Organic Vapor Phase Epitaxy (MOVPE) process; and
    providing a diffusion barrier at least in contact with each side wall of the at least two identical STI structures and with side walls of the III-V fin structure, wherein the diffusion barrier is an oxide comprising a metal silicate, and wherein providing the diffusion barrier further comprises depositing the metal using Molecular Beam Epitaxy (MBE) and subsequently performing a thermal anneal process, thereby forming the metal silicate.

2. The method according to claim 1, wherein the III-V fin structure is produced using the Aspect Ratio Trapping (ART) technique.

3. The method according to claim 1, wherein the thermal anneal process is performed at a temperature less than 300° C.

4. The method according to claim 1, wherein the diffusion barrier has a thickness between 1 nm and 10 nm.

5. The method according to claim 1, wherein providing the at least two identical STI structures comprises:
    forming at least two identical trenches in the semiconductor substrate, wherein the at least two identical trenches are separated by a portion of the semiconductor substrate having a pre-defined width;
    depositing a dielectric material over the semiconductor substrate thereby filling the at least two identical trenches;

planarizing the dielectric material thereby exposing the top surface of the portion of the semiconductor substrate; and recessing the portion of the semiconductor substrate thereby creating the gap.

6. The method according to claim 5, wherein providing the diffusion barrier comprises coating the semiconductor substrate with the diffusion barrier before depositing the dielectric material.

7. The method according to claim 5, wherein providing the diffusion barrier comprises coating the semiconductor substrate after recessing the portion.

8. The method according to claim 7, further comprising, before producing the III-V fin structure, performing an etch process to remove the diffusion barrier, thereby exposing at least the surface of the semiconductor substrate in between the at least two identical STI structures.

9. The method according to claim 8, wherein the etch process is an anisotropic dry etch thereby further exposing the top surface of the at least two identical STI structures.

10. The method according to claim 8, wherein the etch process is a metal etch using a hydrogen-based chemistry.

11. The method according to claim 10, wherein the metal etch process is a wet etch process.

12. A semiconductor structure comprising:
a semiconductor substrate, wherein the semiconductor substrate is a Si substrate;
at least two identical STI structures in the semiconductor substrate, wherein the at least two identical STI structures are SiO2;
a III-V fin structure on the semiconductor substrate and between the at least two identical STI structures, wherein the III-V fin structure is formed using a Metal Organic Vapor Phase Epitaxy (MOVPE) process; and
a diffusion barrier, wherein the diffusion barrier coats at least each side of the at least two identical STI structures and contacts side walls of the III-V fin structure, wherein the diffusion barrier is an oxide comprising a metal silicate formed by depositing the metal using Molecular Beam Epitaxy (MBE) and subsequently performing a thermal anneal process, and wherein the diffusion barrier has a thickness in the range of 1 nm to 10 nm.

13. An integrated circuit comprising a semiconductor structure according to claim 12.

* * * * *